July 12, 1960 A. SZYMANSKI 2,945,192
FREQUENCY MODULATED CRYSTAL GENERATOR
Filed Sept. 16, 1957
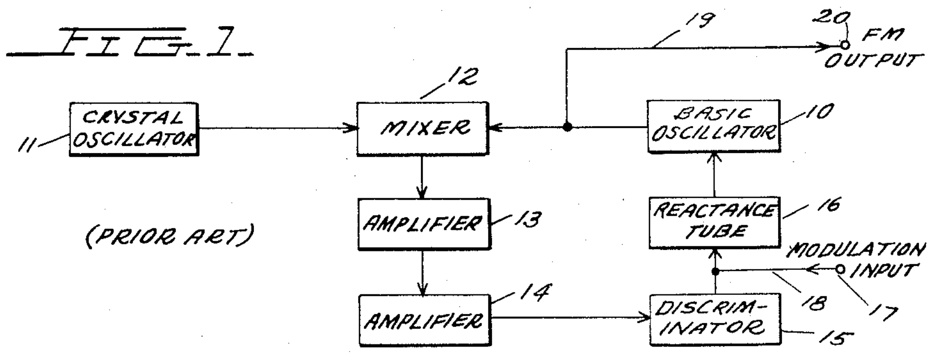
FIG. 2
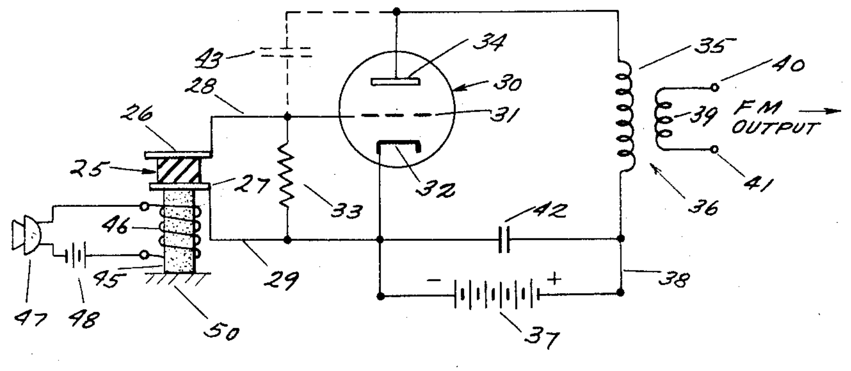
FIG. 3
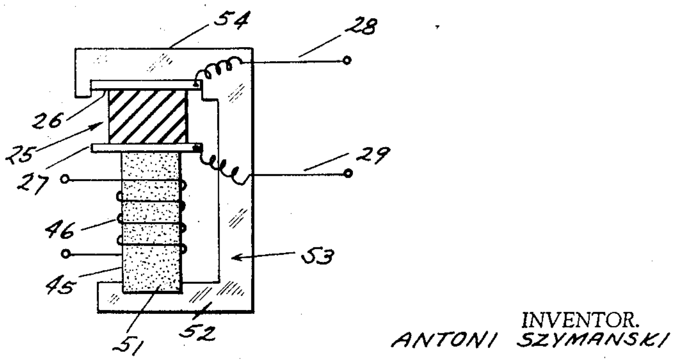
INVENTOR.
ANTONI SZYMANSKI
BY Ostrolenk, Faber, Gerb & Soffen
ATTORNEYS 2,945,192

FREQUENCY MODULATED CRYSTAL GENERATOR

Antoni Szymanski, Los Angeles, Calif., assignor to Standard Coil Products Co., Inc., Melrose Park, Ill., a corporation of Illinois Filed Sept. 16, 1957, Ser. No. 684,036

1 Claim. (Cl. 332—26)

This invention relates to novel systems for the generation of frequency modulated signals, and more particularly relates to a crystal controlled oscillator that is frequency modulated in a simplified and inexpensive manner.

In the prior art, the frequency stability which frequency modulated systems required involved a relatively large number of tubes and coupled circuits. In conventional frequency modulation system, a crystal oscillator was utilized separate from the main oscillator, and a mixer circuit including a discriminator was employed to detect differences in the basic frequency of the two oscillators. These differences were impressed upon a reactance tube which controlled the main oscillator frequency.

In accordance with the present invention, I provide a direct and simple method of utilizing a crystal oscillator, and provide the generation of frequency modulated signal therewith. Towards this end I mechanically coupled a magnetostriction element with the crystal. The modulation signal such as audio frequency, is impressed upon the magnetostriction element in a manner to change the basic frequency of the crystal oscillator about its mean frequency. In this manner, I directly derive frequency modulation about a basic accurate mean frequency in a single stage, such as with a triode or a transistor.

The complexity of a separate reference oscillator, a mixer, a discriminator and a reactance tube is eliminated by the invention arrangement. Further, direct modulation of the crystal controlled frequency in the manner of the present invention permits miniaturization of an FM transmitter to degree heretofore unattaintable. The use of a small subminiature triode, or an equivalent transistor, together with the aforesaid magnetostriction coupled crystal for the frequency modulation, makes it possible to incorporate a whole such transmitter circuit in the size of a wristwatch case.

A primary object of the present invention is to provide a novel frequency modulated circuit arrangement.

Another object of the present invention is to provide a novel compact relatively inexpensive frequency modulation RF generator system.

A further object of the present invention is to provide a novel RF crystal oscillator circuit which is directly modulated as FM by audio signals.

Still another object of the present invention is to provide frequency modulation of a crystal oscillation generator by direct coupling with a magnetostriction element, which is in turn energized by the modulating signals.

Still a further object of the present invention is to provide a novel frequency modulated RF transmitter circuit capable of extreme miniaturization.

These and further objects of the present invention will become more apparent in the following description of an exemplary embodiment thereof illustrated in the drawing, in which:

Figure 1 is a block diagram of a conventional prior art frequency modulation RF system.

Figure 2 is a schematic representation of the invention system, showing a magnetostriction element mechanically coupled with a crystal oscillator for the frequency modulation.

Figure 3 is an enlarged view of a modified magnetostriction-to-crystal coupling arrangement for the invention system.

As is well known in the art, frequency modulation generators or transmitters require a high degree stability of the basic or mean frequency thereof. Such basic frequency is thereupon varied about the mean, in accordance with the amplitude or frequency of the modulating signals. Figure 1 is a block diagrammatic representation of a conventional prior art frequency modulated system, generally in the RF region. The basic oscillator 10 is automatically controlled to its mean or predetermined frequency by reference crystal oscillator 11, and intermediate circuitry. A mixer circuit 12 compares the frequency between basic oscillator 10 and crystal oscillator 11. The mixer output is amplified at amplifiers 13 and 14 and fed to discriminator 15. The discriminator 15 actuates reactance tube 16, which in turn maintains the basic oscillator 10 at its correct predetermined mean frequency.

Modulation of the basic oscillator 10, in the frequency modulation mode, is obtained by connecting the modulatoin input to terminal 17 which connects, through lead 18, to reactance tube 16. This in turn deviates the frequency of the basic oscillator 10 in correspondence with the modulation signals. The output of the frequency modulated oscillator 10 is connected to the FM output terminal 20 through lead 19.

Should one attempt to directly control a crystal oscillator by a reactance tube to obtain frequency modulation, either the frequency stability or the FM sensitivity of the resultant system is sacrifised. In accordance with the invention system, at least six tubes and associated circuitry are eliminated over the prior art. This is basically accomplished by utilizing a single reference oscillator, which is effected by a crystal. A simple crystal oscillator produces the mean or predetermined frequency which is to be frequency modulated. This crystal is mechanically coupled directly to a magnetostriction element, so arranged as to cause a frequency change of the controlling crystal when energy is applied to the magnetostriction element.

Figure 2 is a schematic diagram of the invention system. The controlling crystal is indicated at 25 and is connected directly to the grid input circuit of a triode vacuum tube 30 through associated electrodes or plates 26, 27 affixed to opposite faces of the crystal 25. Metallic plate 26 is connected through lead 28 to the grid electrode 31 of triode 30. Metallic electrode 27 is connected to the cathode electrode 32 of triode 30 through lead 29. A grid leak 33 is connected between the grid 31 and cathode 32.

The plate electrode 34 of triode 30 is connected to the primary winding 35 of output transformer 36. The anode potential from battery 37 is connected by lead 38 to the output primary coil 35, and in turn to anode 34. The negative side of battery 35 connects to cathode 32, which may be a ground potential. Secondary winding 39 of output transformer 36 establishes the output terminal connections 40, 41 of the frequency modulated generator. A by-pass condenser 42 is connected across battery 37.

The basic or controlling oscillator frequency, derived by crystal 25, is accomplished with triode 30 through the feed-back or intercoupling through the inherent capacitance 43 between anode 34 and grid 31 electrodes. Such feed-back is due to the Miller effect in triode 30. The predetermined frequency of the oscillator circuit of Figure 2 is controlled by the mechanical resonance frequency of the crystal 25.

Crystal 25 is a piezoelectric element which may be of quartz, Rochelle salt, a ceramic titanate, etc. The physical characteristics of crystal 25 determine its resonant frequency, which becomes the basic or mean frequency of the oscillator for the invention frequency modulation system. The capacity feed-back through inherent inter-electrode capacitance 43, establishes the basic frequency in the triode oscillator circuit. When no modulation is occurring, the output at terminals 40, 41 is at such basic or mean frequency.

A suitable magnetostriction element, in a form such as a tube or bar 45, is mechanically coupled to one of the electrodes or plates of crystal 25, namely plate 27 in Figure 2. Such mechanical coupling results in the mechanical vibration of crystal 25 due to the magnetostriction action of element 45 in a manner to be described. The magnetostriction element 45 in the exemplary embodiment is ferrite. However, other equivalent materials may instead be utilized, within the scope of the invention. A winding 46 surrounds the ferrite element 45, to set up magnetic action in the element 45.

The magnetostriction action, namely the longitudinal expansion and contraction of the element 45 is derived in accordance with undulations or variations in current passing through coil 46. Such undulations or modulation of the current in coil 46 occurs as by audio frequency signals. The audio signals may be derived directly from a microphone 47 and a biasing D.C. battery 48 in circuit with coil 46. The magnetostriction or ferrite element 45 is shown secured at its outer end to a reference base or mechanical ground 50.

I have found through numerous tests and practical operation, that a ferrite core 45 directly mechanically coupled to crystal element 25 at plate 27, with element 25 of type H material, results in commercially useful frequency modulation signals, derived with stable controlling frequency by the system of Figure 2. Such system has been found to be reasonably stable with normal ambient temperature change, and electrically and mechanically stable in view of its simplicity and effective cooperation of its circuital elements.

Figure 3 illustrates a modified crystal-magnetostriction unit. The ferrite rod 45 is secured to crystal plate 27 as in Figure 2. The base 51 of rod 45 is mounted in arm 52 of a C-clamp 53. The upper plate 26 of crystal 25 is similarly set into arm 54 of the C-clamp 53. The distance between the co-acting surfaces of arms 52 and 54 is pre-set in accordance with a particular construction of the crystal 25 and its associated ferrite element 45. Arm 52 corresponds to mechanical ground 50 of Figure 2, whereas arm 54 establishes a spaced base therefrom to integrate the mechanical extent between the end 51 of element 45 and top plate 26 of crystal 25. Such spacing or predetermined distance corresponds to the mean frequency pressure on crystal 25 at zero modulation frequency in coil 46. C-clamp 53 is preferably of insulation material such as ceramic. C-clamp 53 is shown as a solid member but may be sectional for adjustment of the spacing between the inner sides of arms 52, 54.

By constraining the mean position of the top of crystal 25 at plate 26, and the bottom 51 of ferrite element 45, between associated clamp arms 54 and 52, undulating current through modulating coil 46 effects efficient longitudinal variation. Such variation is in the longitudinal dimension of ferrite element 45 by magneostriction action, in turn varying the frequency of resonance of crystal 25. The frequency of the output of the oscillator triode 30 is thereby controlled, and results at terminals 40, 41. The arrangement of Figure 3 is more efficient as compared to Figure 2 in view of the constrained ends of the composite crystal-ferrite unit 25, 45.

By making C-clamp 53 of magnetized permanent magnet material, establishing permanent magnetization through the ferrite coil 45 thereby, the biasing battery 48 of Figure 2 may be eliminated. In this manner, the undulations through the voice signals at microphone 47 in coil 46 are established to operate the crystal ferrite unit 25, 45 in the stated manner. In other words, the permanent magnet field through the ferrite coil 45 is equivalent to the D.C. bias action of battery 48 (Figure 2) in the resultant effect on crystal 25 by the modulating signals.

The magnetostriction characteristic of element 45 is responsive to the variation in current in surrounding winding 46, and effectuates corresponding longitudinal dimensional changes in the element 45. Resonance changes in the crystal unit 25 and the associated metallic plates 26, 27 are thus effectuated. In this manner, the basic frequency of the oscillator triode 30 of Figure 2 is varied from the normal or mean frequency which the unmodulated crystal 25 would otherwise assume.

The extent of the frequency modulation swing of the mean frequency is dependent upon the relative intensity of the peak current impressed upon the modulating winding 46, which in turn creates a greater magnetostriction force and resultant mechanical resonance change of the crystal 26. The resultant frequency modulated signals have been found to be practical, and without problems of phase shift, delay, etc. The magnetostriction action due to the modulation signals effects the swing of the resonance of the crystal 25 from its norm which normal frequency is promptly resumed when the audio or other modulating frequencies in modulating coil 46 are removed.

The output of the frequency modulated generator of Figure 2, at terminals 40, 41 is impressed upon further utilization circuitry (not shown), such as amplifier, antennae, in the usual manner. The reception and detection of the resultant frequency modulated signals are carried out with conventional circuitry. The simplicity and direct action of the frequency modulation circuit of the present invention are important and practical, in commercial aspects thereof. The fact that extreme miniaturization of the invention system is feasible makes it useful in areas of application which the prior complex systems referred to could not be used. The inherent frequency stability of the invention system further makes it useful in place of prior complex systems, at advantageous economy.

Although the present invention has been described in connection with exemplary embodiments thereof, it is to be understood that modifications may be made in its construction and utilization without departing from the broader spirit and scope of the invention, as defined in the following claim.

I claim:

An audio frequency modulated signal generator of the character described comprising an oscillator circuit including a crystal resonator with conductive plates on opposed faces thereof to determine the mean frequency of the oscillator circuit, an output winding for the oscillator circuit, a magnetostriction rod of ferrite material mechanically secured to one of said plates, circuit means for actuating said rod in accordance with modulating audio frequency signals, said rod being proportioned to correspondingly alter the resonance frequency of said resonator and thereby the frequency of said oscillator circuit whereby the oscillator circuit output signal is frequency modulated in accordance with the modulating signals, and a C-clamp with two opposed arms, said crystal and rod being aligned in a linear relation with the unsecured crystal and rod end regions being pressed between the C-clamp arms, said C-clamp arms being predeterminedly spaced to constrain said crystal resonator at a mean frequency pressure and thereby emphasize its frequency modulation action in the oscillator circuit.

References Cited in the file of this patent

UNITED STATES PATENTS

| | | |
|---|---|---|
| 1,841,459 | Taylor | Jan. 19, 1932 |
| 2,471,542 | Rich | May 31, 1949 |
| 2,551,848 | Parker | May 8, 1951 |
| 2,636,135 | Peek | Apr. 21, 1953 |
| 2,687,511 | Penniman | Aug. 24, 1954 |
| 2,736,824 | Roberts | Feb. 28, 1956 |